(12) United States Patent
Ribaudo et al.

(10) Patent No.: US 8,987,754 B1
(45) Date of Patent: Mar. 24, 2015

(54) HIGHLY DIRECTIONAL THERMAL EMITTER

(71) Applicant: Sandia Corporation, Albuquerque, NM (US)

(72) Inventors: Troy Ribaudo, Portland, OR (US); Eric A. Shaner, Rio Rancho, NM (US); Paul Davids, Albuquerque, NM (US); David W. Peters, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 14/028,181

(22) Filed: Sep. 16, 2013

(51) Int. Cl.
| H01L 27/15 | (2006.01) |
| G01J 1/00 | (2006.01) |
| H01L 49/00 | (2006.01) |
| H01L 31/101 | (2006.01) |
| H01L 27/16 | (2006.01) |
| H01L 33/00 | (2010.01) |

(52) U.S. Cl.
CPC ............... *H01L 49/00* (2013.01); *H01L 31/101* (2013.01); *H01L 27/16* (2013.01); *H01L 33/0004* (2013.01)
USPC .......................................... 257/79; 250/495.1

(58) Field of Classification Search
None
See application file for complete search history.

(56) References Cited

U.S. PATENT DOCUMENTS

| 6,611,085 B1 * | 8/2003 | Gee et al. ...................... 313/271 |
| 8,492,737 B2 * | 7/2013 | Araci et al. ............... 250/504 R |
| 2012/0235067 A1 * | 9/2012 | Araci et al. ............... 250/504 R |

OTHER PUBLICATIONS

Tay et al., Plasmonic thermal IR emitters based on nanoamorphous carbon, Appl. Phys. Lett. 94, 071113 (2009).*
Sirtori, Carlo et al., "Long-wavelength semiconductor lasers with waveguides based on surface plasmons", Optics Letters, Sep. 1998, pp. 1366-1368, vol. 23, No. 17.
Ginn, James C. et al., "Infrared plasmons on heavily-doped silicon", Journal of Applied Physics, Aug. 2011, pp. 043110-1-43110-6, vol. 110.
Hesketh, Peter J. et al., "Polarized spectral emittance from periodic micromachined surfaces. I. Doped silicon: The normal direction", Physical Review B, Jun. 1988, pp. 10795-10802, vol. 37, No. 18.
Hesketh, Peter J. et al., "Polarized spectral emittance from periodic micromachined surfaces. II. Doped silicon: Angular variation", Physical Review B, Jun. 1988, pp. 10803-10813, vol. 37 No. 18.
Auslender, M. et al., "Zero infrared reflectance anomaly in doped silicon lamellar gratings. I. From antireflection to total absorption", Infrared Physics & Technology, 1995, pp. 1077-1088, vol. 36.
Cleary, J. W. et al., "IR permittivities for silicides and doped silicon", Journal of the Optical Society of America B, Apr. 2010, pp. 730-734, vol. 27 No. 4.
Shahzad, Monas et al., "Infrared surface waves on semiconductor and conducting polymer", Proceedings of SPIE, 2010, pp. 80240B-1-80240B-8, vol. 8024.

* cited by examiner

*Primary Examiner* — Andres Munoz
(74) *Attorney, Agent, or Firm* — Kevin W. Bieg

(57) ABSTRACT

A highly directional thermal emitter device comprises a two-dimensional periodic array of heavily doped semiconductor structures on a surface of a substrate. The array provides a highly directional thermal emission at a peak wavelength between 3 and 15 microns when the array is heated. For example, highly doped silicon (HDSi) with a plasma frequency in the mid-wave infrared was used to fabricate nearly perfect absorbing two-dimensional gratings structures that function as highly directional thermal radiators. The absorption and emission characteristics of the HDSi devices possessed a high degree of angular dependence for infrared absorption in the 10-12 micron range, while maintaining high reflectivity of solar radiation (~64%) at large incidence angles.

14 Claims, 7 Drawing Sheets

HIGHLY DIRECTIONAL THERMAL EMITTER

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to thermal emission and, in particular, to a highly directional thermal emitter.

BACKGROUND OF THE INVENTION

Surface plasmons are coherent electron oscillations that exist at the interface between any two materials where the real part of the dielectric function changes sign across the interface (e.g., a metal-dielectric interface). When surface plasmons couple with an incident photon, the resulting hybridized excitation is called a surface plasmon polariton (SPP). Therefore SPPs are bound electromagnetic modes that can occur at metal-dielectric interfaces and correspond to polarization waves of free electrons in the metal. Therefore, electromagnetic modes can propagate along a bare metal surface and decrease exponentially in the perpendicular direction, thereby strongly confining light to the surface until energy is lost either via absorption in the metal or radiation into free space.

An optical grating is formed by a periodically modulated interface between a dielectric and a metal. It is well known that at such structured surfaces, the absorption may strongly depend on the angle of incidence and the polarization of the incident light. Therefore, in angular reflectivity measurements, minima are observed at specific angles of incidence that are attributed to the incident light being transformed into a SPP wave which dissipates the energy in the metal, finally being converted to thermal energy. Conversely, if the thermal energy of the metal is high enough to populate surface plasmon states, the grating can transform these excitations into plane electromagnetic waves leaving the surface, leading to a maximum in emission observed near the angle at which the minimum of reflectivity is observed in the reflectivity measurement, as expected according to Kirchhoff's law of thermal radiation. Specifically, surface waves that are excited by heating the metal are diffracted by the grating in directions for which the condition of phase matching is met as a result of some spatial coherence in the surface plane. Therefore, the absorption and emission spectra can be highly directional and of a narrow bandwidth defined by the symmetry and periodicity of the surface structure for a given wavelength.

Surface plasmons in the mid-wave and long-wave infrared (LWIR), nominally 3-15 µm, have notable differences to plasmons in the visible and near-infrared part of the electromagnetic spectrum. Two defining characteristics of SPP modes are the propagation length, $\delta_{spp}$, and the dielectric surface penetration depth, $k_d$. These features are directly proportional to one another over all frequency ranges, but exist in opposite extremes for the visible and infrared (IR), with propagation length and dielectric penetration being small in comparison to wavelength in the visible, and quite large in the infrared. These physical properties of the LWIR SPP's have made it a challenge to find efficient applications in this frequency range, though some have been demonstrated. See C. Sirtori et al., *Opt. Lett.* 23, 1366 (1998); and N. Yu et al., *Nature Photonics* 2, 564 (2008). For example, performance of the quantum cascade laser (QCL) has been improved through the use of SPP waveguide modes, while the beam profile and polarization state of mid-IR QCL's have been modified using SPP's as well.

However, for further applications to be developed, a need remains for long-wavelength plasmons that can be generated with the high confinement and high loss of conventional SPP's. One potential application of long-wavelength plasmons is directional emission, where plasmon radiation loss can be beneficial. Careful design of a periodic surface structure can allow the emission (absorption) to occur only over a narrow angular range.

SUMMARY OF THE INVENTION

The present invention is directed to highly directional thermal emitter device comprising a two-dimensional periodic array of heavily doped semiconductor structures on a surface of a substrate, wherein each structure has similar height and side lengths and wherein the periodic array has a characteristic periodicity in each direction, such that the array provides a highly directional thermal emission at a peak wavelength between 3 and 15 microns (i.e., mid- to long-wave infrared) when the array is heated. The two-dimensional periodic array can be biperiodic or have different periodicity in the orthogonal directions. The heavily doped semiconductor can comprise a group IV semiconductor, such as silicon, or a compound semiconductor, such as indium arsenide. The heavily doped semiconductor can be n-doped or p-doped. The dopant density can be greater than $1\times10^{20}$ cm$^{-3}$.

As an example of the invention, highly doped silicon (HDSi) with a plasma frequency in the mid-wave infrared was used to fabricate nearly perfect absorbing two-dimensional gratings structures that function as highly directional thermal radiators. The absorption and emission characteristics of the devices possessed a high degree of angular dependence for infrared absorption in the 10-12 micron range, while maintaining high reflectivity of solar radiation (~64%) at large incidence angles. Increased bandwidth tailoring can be achieved with further modification of the two-dimensional pattern.

BRIEF DESCRIPTION OF THE DRAWINGS

The detailed description will refer to the following drawings, wherein like elements are referred to by like numbers.

FIG. 3A is a plot with w=6 µm, h=1.5 µm, and varying period. FIG. 3B is a plot with Λ=9 w=6 µm, and varying mesa height. FIG. 3C is a plot with Λ=9 µm, h=1.5 µm, and varying mesa side length.

FIG. 6A is a contour plot from HDR measurements for P polarized with the Littrow condition overlaid. FIG. 6C is a contour plot from HDR measurements for S polarized. FIG. 6E is a contour plot from HDR measurements for the average of P and S polarized. FIG. 6B is a contour plot from RCWA simulations for P polarized. FIG. 6D is a contour plot from RCWA simulations for S polarized. FIG. 6F is a contour plot from RCWA simulations for the average of P and S polarized.

DETAILED DESCRIPTION OF THE INVENTION

Figure 1:
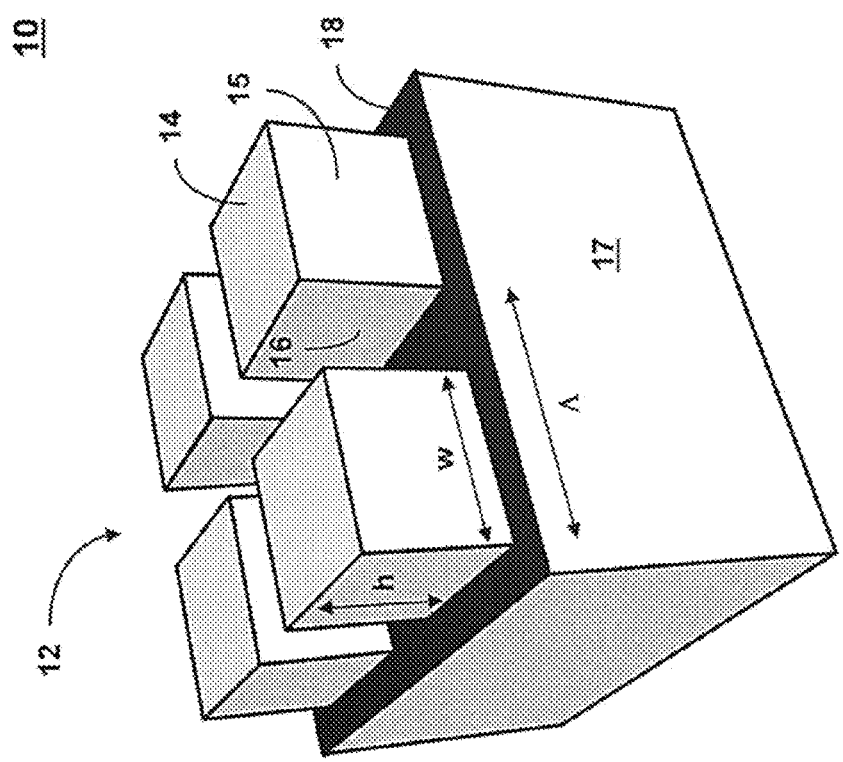
FIG. 1 is a schematic illustration of a highly directional thermal emitter device.

The surface plasmon dispersion relation is given by:

$$k_{sp} = k_0 \sqrt{\frac{\varepsilon_m \varepsilon_d}{\varepsilon_m + \varepsilon_d}}, \tag{1}$$

where $k_0$ is the free space propagation vector and $\in_m$ and $\in_d$ are the complex metal and dielectric permittivities, respectively. All plasmon mode characteristics can be determined from this relation which is dependent on the relative magnitudes of $\in_m$ and $\in_d$. The variation in the magnitudes of $\in_m$ for the visible and infrared (IR) is the source of the physical distinctions and can be easily understood by using the Drude model to describe the optical dispersion of a medium with free electrons subject to collisional damping. Here, the frequency dependent permittivity is expressed as:

$$\varepsilon(\omega) = \varepsilon_\infty \left(1 + \frac{i\omega_p^2 \tau}{\omega(1 - i\omega\tau)}\right), \tag{2}$$

where $\in_\infty$ is the high frequency permittivity, $\omega$ is the exciting frequency, $\tau$ is the collision rate, and the plasma frequency:

$$\omega_p^2 = \frac{ne^2}{m^* \varepsilon_0 \varepsilon_\infty}, \tag{3}$$

is a function of the carrier density n, the effective mass m*, and $\in_\infty$. In conventional metals, the plasma frequency is in the ultraviolet (UV), and for excitation frequencies which are slightly lower, the real part of the permittivity is negative and of single digit order. As excitation frequency decreases, the effective permittivity increases and rapidly reaches very large values. A material with a plasma frequency in close proximity to the infrared will provide a smaller permittivity, which in turn could support IR SPP's with the desired properties.

One alternative to noble metals which exhibits a controllable plasma frequency is heavily doped silicon (HDSi). See J. C. Ginn et al., *J. Appl. Phys.* 110, 043110 (2011), which is incorporated herein by reference. By controlling the free carrier populations through doping, the plasma frequency can be tuned to the IR. Tuning of the plasma frequency also enables control of the electromagnetic dispersion and sub-wavelength confinement of the SPP mode near the doped Si surface. There has been significant research conducted on this material in the last 30 years. Hesketh et al. demonstrated control over the emissivity of a one-dimensional grating fabricated from HDSi and also investigated the angular dependence of those properties, while Auslender and Hava furthered this work by demonstrating perfect absorption with one dimensional HDSi gratings designed for resonance at 10.6 μms. See P. J. Hesketh et al., *Phys. Rev. B.* 37, 10795 (1988); P. J. Hesketh et al., *Phys. Rev. B.* 37, 10803 (1988); and M. Auslender and S. Hava, *Infrared Phys. & Tech.* 36 1077 (1995). In more recent years, Cleary et al. explored the use of doped silicon for surface plasmon waveguides in the long-wave infrared as they offer high confinement and acceptable propagation lengths, while Shazad et al. demonstrated coupling LWIR laser radiation to an HDSi one dimensional grating. See J. W. Cleary et al., *J. Opt. Soc. Am. B* 27(4), 730 (2010); and M. Shahzad et al., *Proc. SPIE* 8024, 80240B (2011).

Design of an Exemplary Highly Directional Thermal Emitter Device

A schematic perspective view illustration of a highly directional thermal emitter device of the present invention is shown in FIG. 1. The device 10 comprises a two-dimensional periodic array 12 of mesas. Each mesa 14 has a side length w and a mesa etch depth or height h. In this exemplary biperiodic array comprising square mesas, the lengths of the sides 15 and 16 are equal. The bidirectional array has a single periodicity $\Lambda$. Therefore, the filling fraction is w/$\Lambda$. Other 2D grating structures can also be used, including two-dimensional arrays with different periodicities in the orthogonal directions and structures with different geometries. Arrays with different periodicities will cause different behavior for the two polarizations of emitted light, possibly increasing the bandwidth of emission and altering the angle-dependent behavior in the orthogonal directions. The periodicity can be approximately equal to or slightly less than the desired peak emission wavelength (e.g., 3 to 15 microns). For example, circular, rectangular, conical, prismatic, or other mesa shapes can also be used. The mesa material is a heavily doped semiconductor. The heavily doped semiconductor can be n-doped or p-doped. With a group IV semiconductor such as silicon, an n-type dopant can be phosphorus, although other group V donor impurities can also be used. Likewise, a p-type dopant can be boron, although other group III acceptor impurities can also be used. The dopant density will depend on the type of dopant used. For example, the dopant density can typically be $1\text{-}3\times10^{20}$ cm$^{-3}$. Compound semiconductors, such as indium arsenide, can also be used. The heavily doped semiconductor can be an ion-implanted layer on a substrate 17. A thin layer of noble metal 18 can be deposited to fill the array troughs to maximize visible light reflectivity. In this device, surface plasmon waves are excited by heating of the array semiconductor material. The resulting surface plasmon assisted emission of radiation can be highly directional in a direction normal to the surface of the device.

As an example of the present invention, HDSi was used as the array material to provide a nearly perfect absorbing two-dimensional grating structure which can be optimized for thermal management applications through directional absorption control at thermal wavelengths and minimization of visible absorption at all angles. An exemplary device exhibits >90% absorption of thermal radiation over a narrow angular cone, extending +/−15° around the surface normal. In accordance with Kirchhoff's law, the thermal emissivity of a material is directly proportional to its thermal absorption characteristics. See G. Kirchhoff, *Phil. Magazine* 20, 1 (1860). Since the exemplary device's transmission is essentially zero, the reflected signal is equivalent to (1−emissivity).

Figure 2:
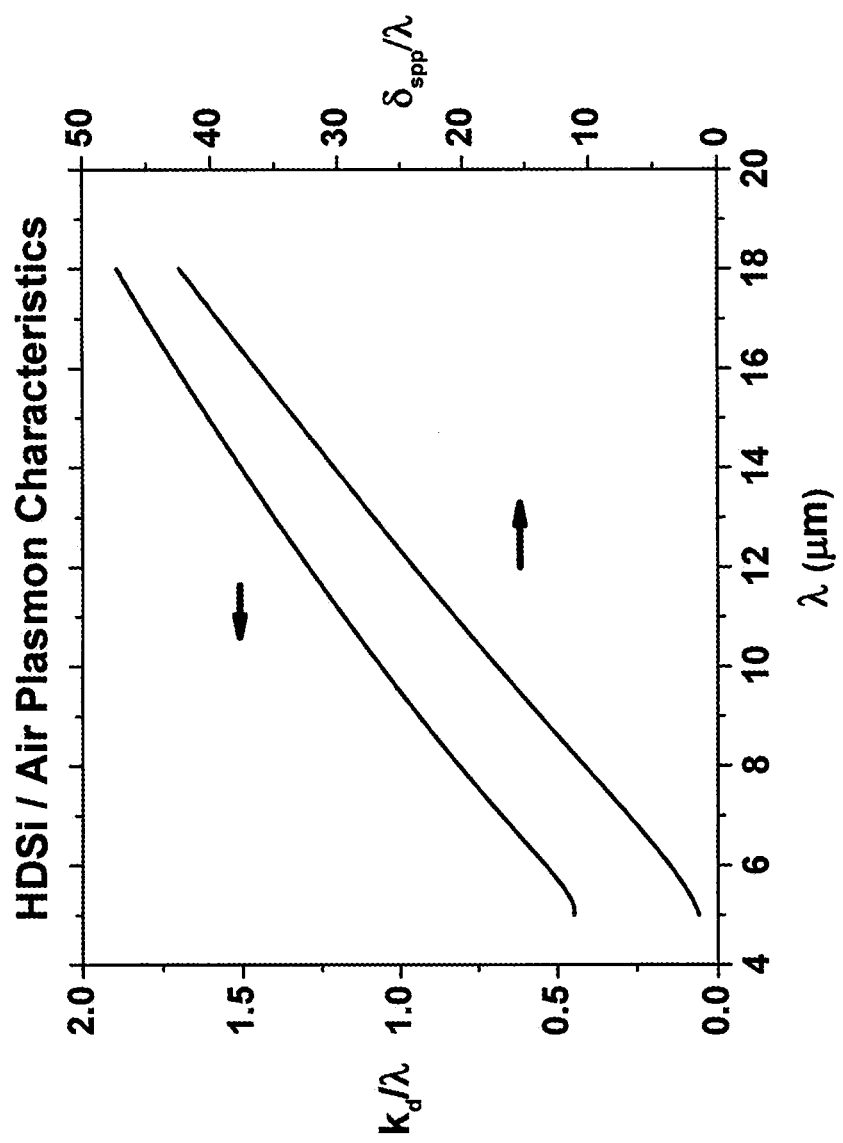
FIG. 2 is a graph of the dielectric penetration depth, $k_d$, and propagation length, $\delta_{spp}$, of HDSi-air plasmons with both quantities normalized to wavelength, $\lambda$.

In the exemplary device, near perfect absorption of unpolarized normal incidence thermal radiation is achieved using a two-dimensional grating structure comprised of an HDSi mesa array with gold spanning the troughs. HDSi mesa material was n-doped with phosphorus to a density of $2.4\times10^{20}$ cm$^{-3}$ as reported by Ginn et al., wherein the doping technique and characterization results are reported. See J. C. Ginn et al., *J. Appl. Phys.* 110, 043110 (2011). The SPP dispersion relation for an air/HDSi interface predicts a mode with tight confinement and high loss, similar to the characteristics of visible SPP's. A plot of these properties is shown in FIG. 2, which indicates that subwavelength SPP confinement is predicted for wavelengths up to 9.5 microns. As is expected, the propagation length is also decreased throughout that infrared range indicating a very high loss mode. It is this high loss mode that can be exploited for the perfect absorption functionality of the highly directional thermal emitter of the present invention.

Figure 3:
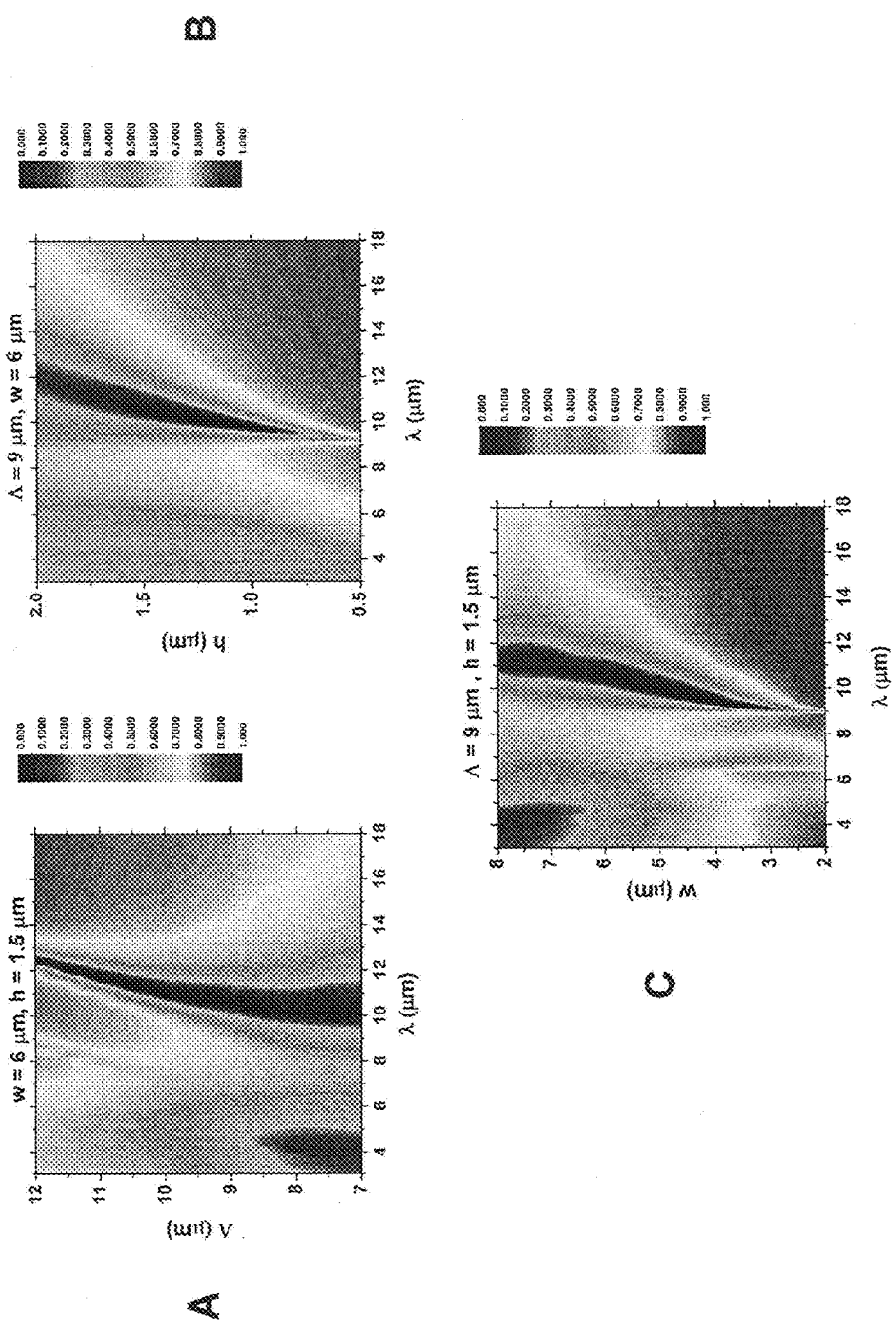
FIGS. 3A-3C are reflectivity contour plots resulting from RCWA parameter sweeps of device geometry.

Initial simulations indicated that near perfect normal incidence LWIR absorption was achievable with a biperiodic device consisting of the HDSi material alone, but in order to maximize high visible light reflectivity, a thin layer of noble metal was added to fill the array troughs. For device fabrication convenience and characterization in the IR frequency range, gold was used for this purpose despite its non-ideal behavior in the visible region. This was an acceptable alteration as simulations showed inconsequential variation in the IR region of the device behavior when the gold was replaced by silver or aluminum. Parameter sweeps were conducted using low resolution rigorous coupled-wave analysis (RCWA) simulations to explore and optimize the thermal absorption dependency on periodicity A, mesa side length w, and mesa etch depth h. FIGS. 3A-3C show reflectivity simulation results for the three cases of fixing two parameters while varying the third. The analysis makes it clear that the maximum in absorption is not solely determined by periodicity, i.e., by the simple surface plasmon conservation equations. It is likely that all of the supported plasmon modes, the HDSi-air, gold-air, and the HDSi-air-HDSi gap plasmon modes existing in between the mesas, all play a role in the enhanced absorption process.

Figure 4:
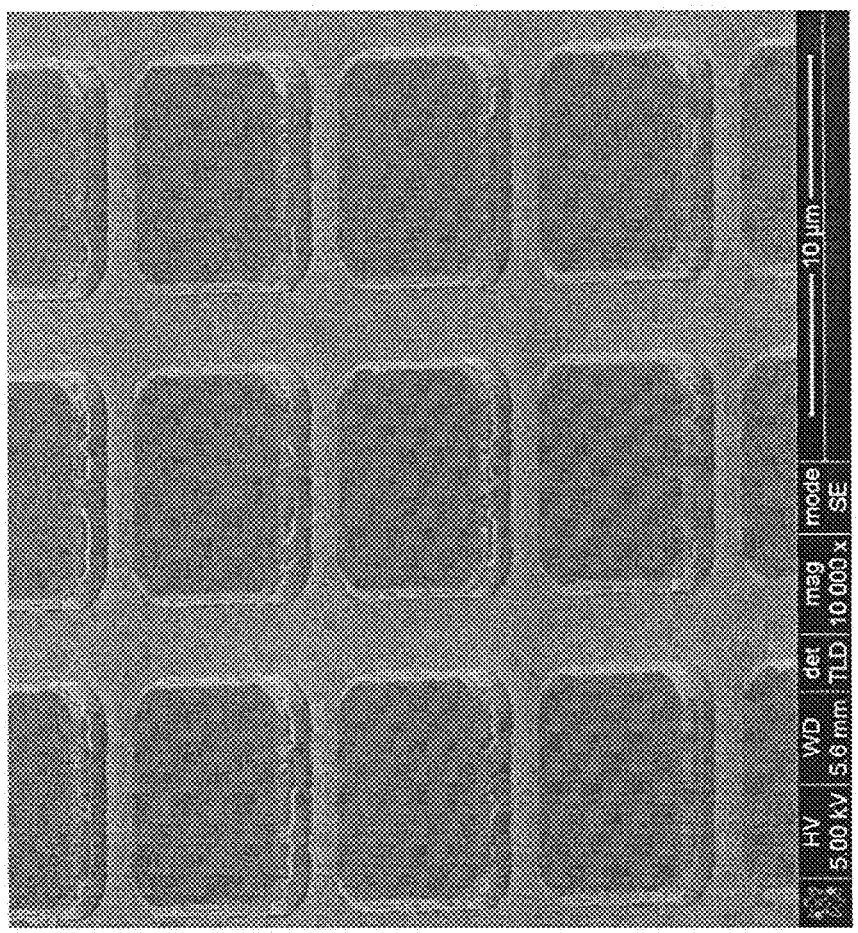
FIG. 4 is an SEM image of HDSi mesa array.

From these simulation results, a geometry consisting of periodicity 9 μm, mesa side length 6 μm (i.e., a filling fraction of 67%) and mesa height 1.5 μm was chosen for more rigorous simulation analysis and for fabrication. The devices were fabricated in a process which relied on a single optical lithography patterning step for both inductively coupled plasma reactive-ion etching (ICP RIE) of the silicon mesas and the titanium-gold (5, 50 nm respectively) metallization patterning for the troughs. A scanning electron microscope (SEM) image of an array portion is shown in FIG. 4. A rounding of the mesa corners and damage to mesa sidewalls is evident and is attributed to the single lithography step; however, no changes to the fabrication process were made to maintain the simple procedure.

Thermal Emitter Device Characterization

Figure 5:
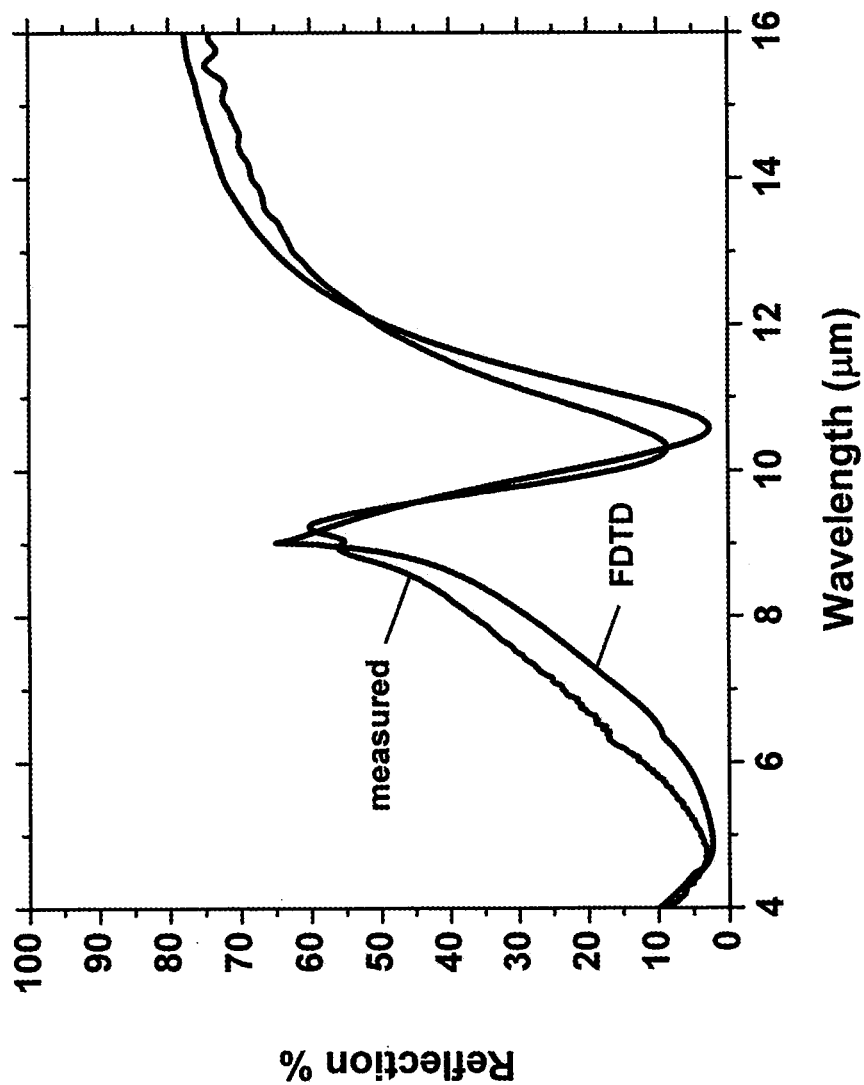
FIG. 5 is a graph of a normal incidence specular reflection measurement and FDTD simulation with angular correction.
Figure 6:
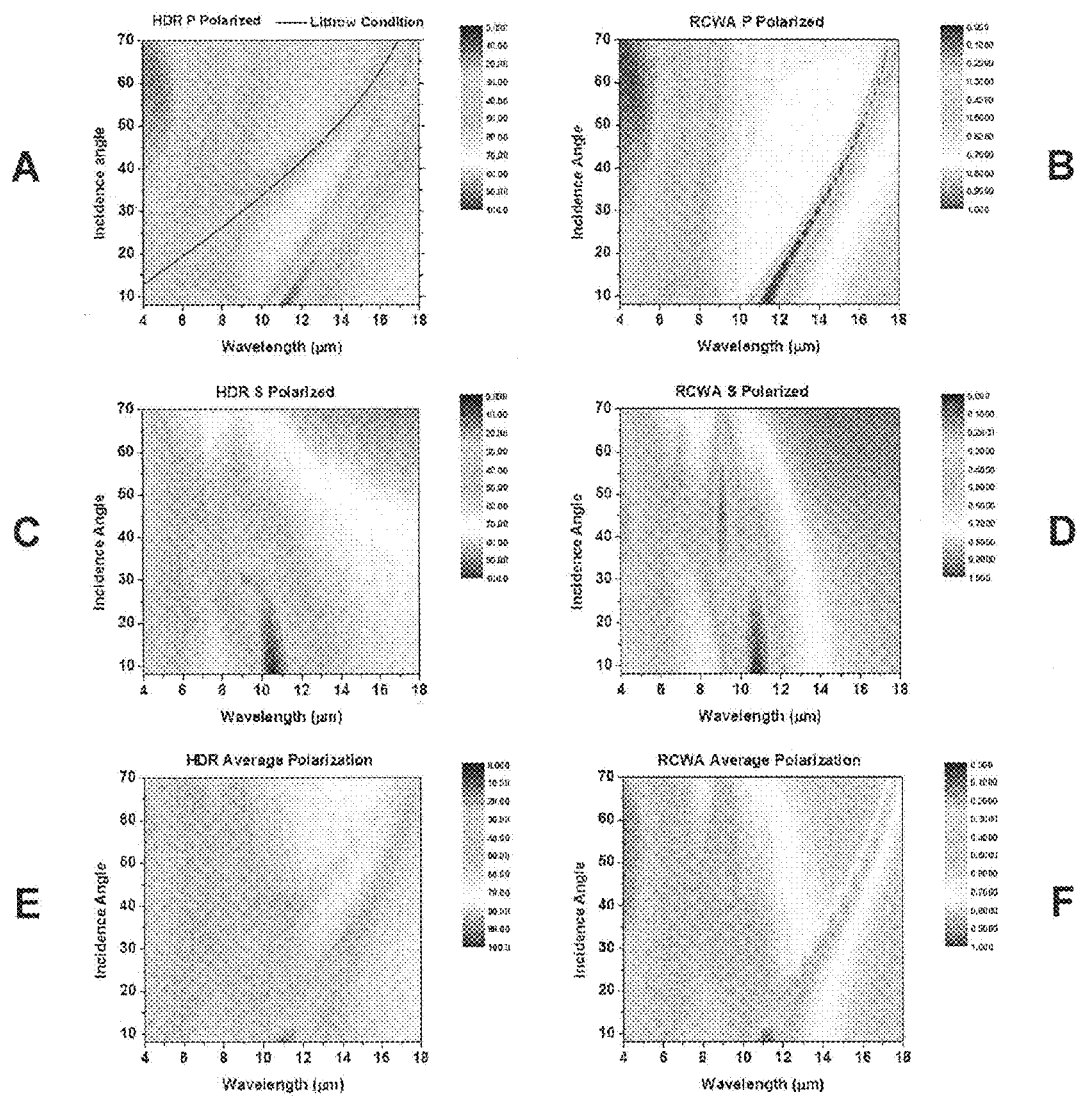
FIGS. 6A-6F are contour plots of angle dependent device reflectivity from HDR measurements and high resolution RCWA simulations.

Normal incidence reflection measurements were performed using a FTIR spectrometer, f/4 optics, and a liquid nitrogen cooled mercury cadmium telluride (MCT) detector. High resolution three-dimensional finite-difference time-domain (FDTD) simulations for the normal incidence reflection were conducted with k-vector corrections to account for grating order losses not recovered in the experiment, i.e., the simulation rejected power diffracted outside of the 10° angular cone that the experiment collected. FIG. 5 shows the normal incidence reflection spectrum and FDTD model results for the exemplary device. As can be seen from the figure, near perfect absorption, ~99% was predicted by the model at 10.6 μm, and a value of ~91% was measured at 10.3 μm. At this wavelength, there is very efficient coupling between the incident waves and the surface waves. The discrepancy between the measured and predicted values is attributed to the curved and damaged silicon sidewalls and variation in structure geometry over the device surface. The agreement can be improved with additional fabrication steps. Angle dependent reflectivity scans were acquired using a hemispherical directional reflectometer (HDR) and a FTIR spectrometer. The HDR system was used to make polarized measurements of both the specular and diffuse components of the radiation reflected and transmitted by a sample for angles ranging from 8°-80°. As these structures exhibit no transmission throughout the measured spectrum, reflection is equivalent to (1−emissivity). Contour plots of the HDR measurement and RCWA simulations of reflection are shown in FIGS. 6A-6F for S (electric field parallel to the surface), P (magnetic field parallel to the surface), and averaged polarization states of the composite specular and diffuse reflection spectra. In the HDR measurement data, an artificial loss is present which is caused by satisfaction of the Littrow condition. The Littrow condition occurs when a diffractive structure is measured in a configuration such that the first order reflected mode is directed to the same angle as the incident beam, thereby reflecting energy back to the source in the HDR system. Due to the optical configuration of the HDR, this light is not recoverable thus giving rise to the spurious loss source. For clarity, a plot of the Littrow solution:

$$\theta = \sin^{-1}(2\lambda/\Lambda) \tag{4}$$

is overlaid on the HDR P-polarized data of FIG. 6A. The Littrow curve is also present in the S-polarized and averaged data contours, though with intensity decreasing and eventually disappearing at higher wavelengths.

While these plots demonstrate the suitability of the structure for highly directional thermal emissivity, it can also be desirable to obtain efficient rejection of the solar spectrum. To evaluate device performance, RCWA simulations using Palik's values for the permittivities of silicon and silver and gold in the 0.2 to 3 μm spectral range were conducted for the unmetallized and metallized geometries. See Edward D. Palik, *Handbook of Optical Constants of Solids*, Elsevier (1998). By integrating the product of the absorption spectra and the black body spectral irradiance for the sun at 5250° C., the uncoated silicon grating structure was found to absorb ~65%, the gold-coated structure absorbed ~56%, and the silver trench structure absorbed only ~35% of the sun's energy at an incidence angle of 45°, with similar values persisting up to normal incidence.

Figure 7:
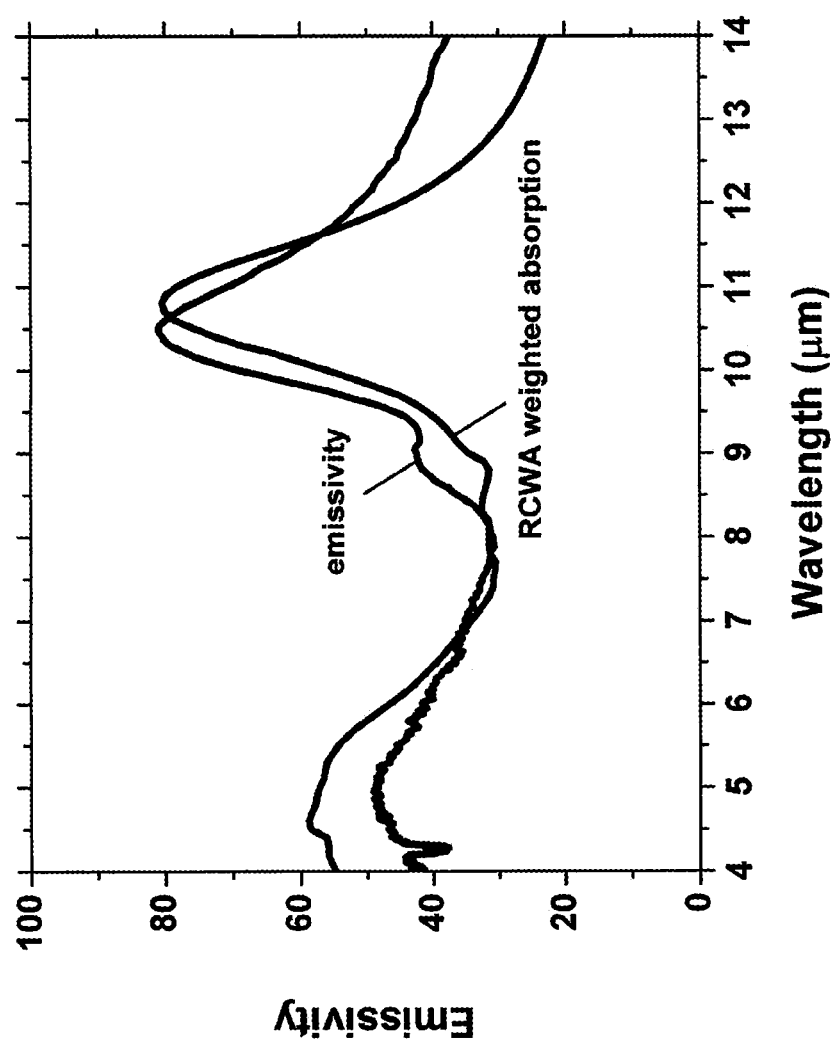
FIG. 7 is a graph of the measured emissivity and image projection weighted RCWA absorption simulations.

Normal incidence emissivity measurements were conducted on the device with a custom built thermal chamber and a FTIR spectrometer. See A. R. Ellis et al., *Proc. SPIE* 7065, 706508 (2008). The sample was mounted on a gold coated cryostat finger along with a matte black painted silicon control sample. A cold shield with a 1×1 cm window was positioned in front of the sample holder. The entire assembly was placed in a vacuum chamber and pumped down to $10^{-6}$ Torr, at which point the cold shield was cooled to 27K to suppress background emissions. Multiple cartridge heaters were used to heat the cryostat finger to the desired temperature (e.g., 150° C.) and FTIR spectra were collected employing the background correction techniques discussed in Ellis et al. The collection optic of the emissivity system was an f/2.5 lens which collects a broad cone of angles thereby convoluting the sample's emissivity up to approximately 11°. To account for this, the image of the sample was projected onto the lens for particular emission angles, and the fraction of the surface area captured by the optic was used as a weighting factor for the RCWA simulated emissivity. Those weighted emissivity numbers were then averaged to replicate the measurement system. FIG. 7 is a graph of the measured normal incidence emissivity and image projection weighted RCWA absorption simulations, again demonstrating good agreement. The sample shows a strong surface plasmon enhanced emission at about 10.5 μm wavelength. This indicates strong coupling between the surface waves and the outgoing waves at a wavelength comparable to the array period.

The present invention has been described as a highly directional thermal emitter. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A highly directional thermal emitter device, comprising:
a two-dimensional periodic array of heavily doped semiconductor structures on a surface of a substrate, wherein the two-dimensional periodic array has a characteristic subwavelength periodicity in each orthogonal direction, and
a metal layer on the surface of the substrate between and in direct contact with the heavily doped semiconductor structures for maximization of visible light reflectivity wherein the characteristic subwavelength periodicity is less than the peak wavelength,
wherein the two-dimensional periodic array provides a highly directional thermal emission at a peak wavelength between 3 and 15 microns when the two-dimensional periodic array is heated.

2. The highly directional thermal emitter device of claim 1, wherein the two-dimensional periodic array comprises a biperiodic pattern.

3. The highly directional thermal emitter device of claim 1, wherein the two-dimensional periodic array has a different characteristic subwavelength periodicity in each orthogonal direction.

4. The highly directional thermal emitter device of claim 1, wherein the heavily doped semiconductor structures comprise a group IV semiconductor.

5. The highly directional thermal emitter device of claim 4, wherein the group IV semiconductor comprises silicon.

6. The highly directional thermal emitter device of claim 1, wherein the heavily doped semiconductor structures comprise a compound semiconductor.

7. The highly directional thermal emitter device of claim 6, wherein the compound semiconductor comprises indium arsenide.

8. The highly directional thermal emitter device of claim 1, wherein the heavily doped semiconductor structures are n-doped.

9. The highly directional thermal emitter device of claim 1, wherein the heavily doped semiconductor structures are p-doped.

10. The highly directional thermal emitter device of claim 1, wherein the dopant density of heavily doped semiconductor structures is greater than $1 \times 10^{20}$ cm$^{-3}$.

11. The highly directional thermal emitter device of claim 1, wherein the metal layer comprises a noble metal.

12. The highly directional thermal emitter device of claim 1, wherein the metal layer comprises aluminum, silver, or gold.

13. The highly directional thermal emitter device of claim 1, wherein a height of the heavily doped semiconductor structures is less than the peak wavelength and greater than 5% of the peak wavelength.

14. The highly directional thermal emitter device of claim 1, wherein the highly directional thermal emission is in a direction normal to the surface of the highly directional thermal emitter device.

* * * * *